United States Patent [19]

Bonora et al.

[11] Patent Number: 4,676,709

[45] Date of Patent: Jun. 30, 1987

[54] LONG ARM MANIPULATOR FOR STANDARD MECHANICAL INTERFACE APPARATUS

[75] Inventors: Anthony C. Bonora, Menlo Park; Andrew W. O'Sullivan, Gilroy, both of Calif.

[73] Assignee: Asyst Technologies, Fremont, Calif.

[21] Appl. No.: 769,709

[22] Filed: Aug. 26, 1985

[51] Int. Cl.$^4$ ............................................. B65G 65/00
[52] U.S. Cl. ................................... 414/217; 414/608; 414/618; 414/733; 414/742
[58] Field of Search ............... 414/217, 221, 222, 225, 414/287, 733, 734, 592, 618, 742, 787, 608

[56] References Cited

U.S. PATENT DOCUMENTS

| | | | |
|---|---|---|---|
| 2,914,203 | 11/1959 | Gafner | 414/734 |
| 3,187,917 | 6/1965 | Miller | 414/592 X |
| 4,336,438 | 6/1982 | Uehara et al. | 414/222 X |
| 4,343,584 | 8/1982 | Hudgins | 414/222 |
| 4,366,423 | 12/1982 | Inaba et al. | 901/17 X |
| 4,412,771 | 11/1983 | Gerlach et al. | 414/217 |
| 4,518,298 | 5/1985 | Yasukawa | 414/589 X |
| 4,532,970 | 8/1985 | Tullis et al. | 414/217 X |

Primary Examiner—Robert J. Spar
Assistant Examiner—Stuart J. Millman
Attorney, Agent, or Firm—Fliesler, Dubb, Meyer & Lovejoy

[57] ABSTRACT

Disclosed is a manipulator for removing a cassette holding articles, such as semiconductor wafers, to be processed from a container supported on a processing station in a standard mechanical interface (SMIF) system. The container is supported on an interface port on the canopy of the processing station and has a removeable door on which the cassette is supportable. A first platform is transportable along a shaft below the interface port and is operable to mate with the interface port and receive the cassette from the container. The first platform is transported down the shaft, thereby removing the cassette from the container. A second platform mounted in the shaft includes a manipulator arm which swings to engage the cassette on the first platform and support the cassette off of the first platform. The manipulator arm then pivots to transport the cassette to a location in the processing station away from the shaft. The first platform is then transported back up the shaft to the interface port to seal the container to prevent particulate contamination. The manipulator arm and the second platform after placing the cassette at a location in the processing station away from the shaft, are then positioned completely inside the shaft to minimize the space taken up in the processing station by the manipulator.

16 Claims, 8 Drawing Figures

LONG ARM MANIPULATOR FOR STANDARD MECHANICAL INTERFACE APPARATUS

CROSS REFERENCE TO RELATED APPLICATIONS

The following commonly assigned applications relate in general to the field of standardized mechanical interface systems.

SEALED STANDARD INTERFACE APPARATUS; Inventors: George Allen Maney, Andrew William O'Sullivan, W. George Faraco; Ser. No.: 635,384; Filed: July 30, 1984.

BOX DOOR ACTUATED RETAINER; Inventors: George Allen Maney, Andrew William O'Sullivan, W. George Faraco; Ser. No. 686,443; Filed: Dec. 24, 1984.

SHORT ARM MANIPULATOR FOR STANDARD MECHANICAL INTERFACE APPARATUS; Inventors: Anthony Charles Bonora; Ser. No. 769,850; Filed: Aug. 26, 1985.

FIELD OF THE INVENTION

The present invention relates to manipulating apparatus for standardized mechanical interface systems for reducing particle contamination and more particularly to apparatus transferring cassettes containing articles to be processed into and out of sealed containers suitable for use in semiconductor processing equipment to prevent particle contamination.

BACKGROUND OF THE INVENTION

A standardized mechanical interface (SMIF) has been proposed to reduce particle contamination by significantly reducing particle fluxes onto wafers. This end is accomplished by mechanically ensuring that during transport, storage and processing of the wafers, the gaseous media (such as air or nitrogen) surrounding the wafers is essentially stationary relative to the wafers and by ensuring that particles from the ambient outside environment do not enter the immediate internal wafer environment.

Control of particulate contamination is imperative for cost effective, high-yielding and profitable manufacturing of VLSI circuits. Because design rules increasingly call for smaller and smaller lines and spaces, it is necessary to exert greater and greater control on the number of particles and to remove particles with smaller and smaller diameters.

Some contamination particles cause process defects, such an incomplete etching in spaces between lines leading to an unwanted electrical bridge. In addition to such physical process defects, other contamination particles may cause electrical failure due to induced ionization or trapping centers in gate dielectrics or junctions.

Modern processing equipment must be concerned with particle sizes which range from below 0.01 micrometers to above 200 micrometers. Particles with these sizes can be very damaging in semiconductor processing. Typical semiconductor processes today employ geometries which are 1 micrometer and under. Unwanted contamination particles which have geometries measuring greater than 0.1 micrometer substantially interfere with 1 micrometer geometry semiconductor devices. The trend, of course, is to have smaller and smaller semiconductor processing geometries.

In typical processing environments today, "clean rooms" are established in which, through filtering and other techniques, attempts are made to remove particles having geometries of 0.03 micrometer and above. There is a need, however, to improve the processing environment. The conventional "clean room" cannot be maintained as particle free as desired. It is virtually impossible to maintain conventional clean rooms free of particles of a 0.01 micrometer size and below.

The main sources of particulate contamination are personnel, equipment, and chemicals. Particles given off by personnel are transmitted through the environment and through physical contact or migration onto the wafer surface. People, by shedding of skin flakes, for example, are a significant source of particles that are easily ionized and cause defects. Although clean room garments reduce particle emissions they do not fully contain the emissions. It has been found that as many as 6000 particles per minute are emitted into an adjacent one cubic foot of space by a fully suited operator.

To control contamination particles, the trend in the industry is to build more elaborate and expensive clean rooms with HEPA and ULPA recirculating air systems. Filter efficiencies of 99.999% and up to ten complete air exchanges per minute are required to obtain an acceptable level of cleanliness.

To minimize process defects, processing equipment manufacturers must prevent machine generated particles from reaching the wafers, and suppliers of gases and liquid chemicals must deliver cleaner products. Most important, a system must be designed that will effectively isolate wafers from particles during storage, transport and transfer into processing equipment. The Standard Mechanical Interface (SMIF) system has been proposed to achieve this goal. The SMIF concept is based on the realization that a small volume of still, particle-free air, with no internal source of particles, is the cleanest possible environment for wafers. Further details of one proposed system are described in the article "SMIF: A TECHNOLOGY FOR WAFER CASSETTE TRANSFER IN VLSI MANUFACTURING", by Mihir Parikh and Ulrich Kaempf, *Solid State Technology*, July 1984, pp. 111-115 and in the above cross-referenced applications.

The proposed SMIF system has three main components, namely, (1) minimum volume, dustproof containers are used for storing and transporting wafer cassettes; (2) canopies are placed over cassette ports of processing equipment so that the environments inside the containers and canopies become miniature clean spaces; (3) doors on the containers are designed to mate with doors on the interface ports on the equipment canopies and the two doors are opened simultaneously so that particles which may have been on the external door surfaces are trapped ("sandwiched") between the doors.

In the proposed SMIF system, a container is placed at the interface port on top of the canopy; latches release the container door and the canopy port door simultaneously. A mechanical elevator lowers the two doors, with the cassette riding on top, into the canopy covered space. A manipulator picks up the cassette and places it onto the cassette port/elevator or other location within the canopy of the equipment. After processing, the reverse operation takes place.

The SMIF system has been proved effective by experiments using prototype SMIF components both inside and outside a clean room. The SMIF configuration achieved a tenfold improvement over the conventional handling of open cassettes inside the clean room.

However, due to the space limitations within the canopy of the processing station, the size and configuration of the elevators and manipulators is important. Furthermore it is desirable that the equipment for removing the cassette holding articles to be processed from the standard mechanical interface container be confined to a small space when not in use while providing a long reach to adjacent equipment.

SUMMARY OF THE INVENTION

The present invention is a manipulator for transferring a cassette, holding articles to be processed, to and from a container supported at a processing station. The processing station has a cassette port for receiving the cassette when the cassette moves along a central axis extending from outside the processing station, through the cassette port, and into the processing station. A cassette platform for supporting the cassette is transportable along the axis for transferring the cassette to and from the container along the central axis. A manipulator is provided for transferring the cassette to and from the central axis to a location offset from the axis whereby the cassette platform can travel along the axis past the cassette in a bypassing relation.

The manipulator includes an arm in an arrangement having a pivot located on and attached to an arm platform. The pivot arm length together with the location of the pivot point on the arm platform establishes a mechanism which maximizes the reach from the central axis while still permitting the co-axial loading and unloading, in a bypassing relationship, of the cassette from and to the cassette platform.

The present invention maximizes the amount of reach of the cassette which can be co-axially loaded and unloaded from the cassette platform. This long-arm feature is particularly useful when the present invention is adapted to SMIF processing apparatus in a clean room environment where the reach dimension needs to be large.

Additional objects and features of the invention will appear from the following description in which the preferred embodiments of the invention have been set forth in detail in conjunction with the drawings.

DETAILED DESCRIPTION

With reference to the Figures, a detailed description of preferred embodiment for the present invention is described.

Figure 1:
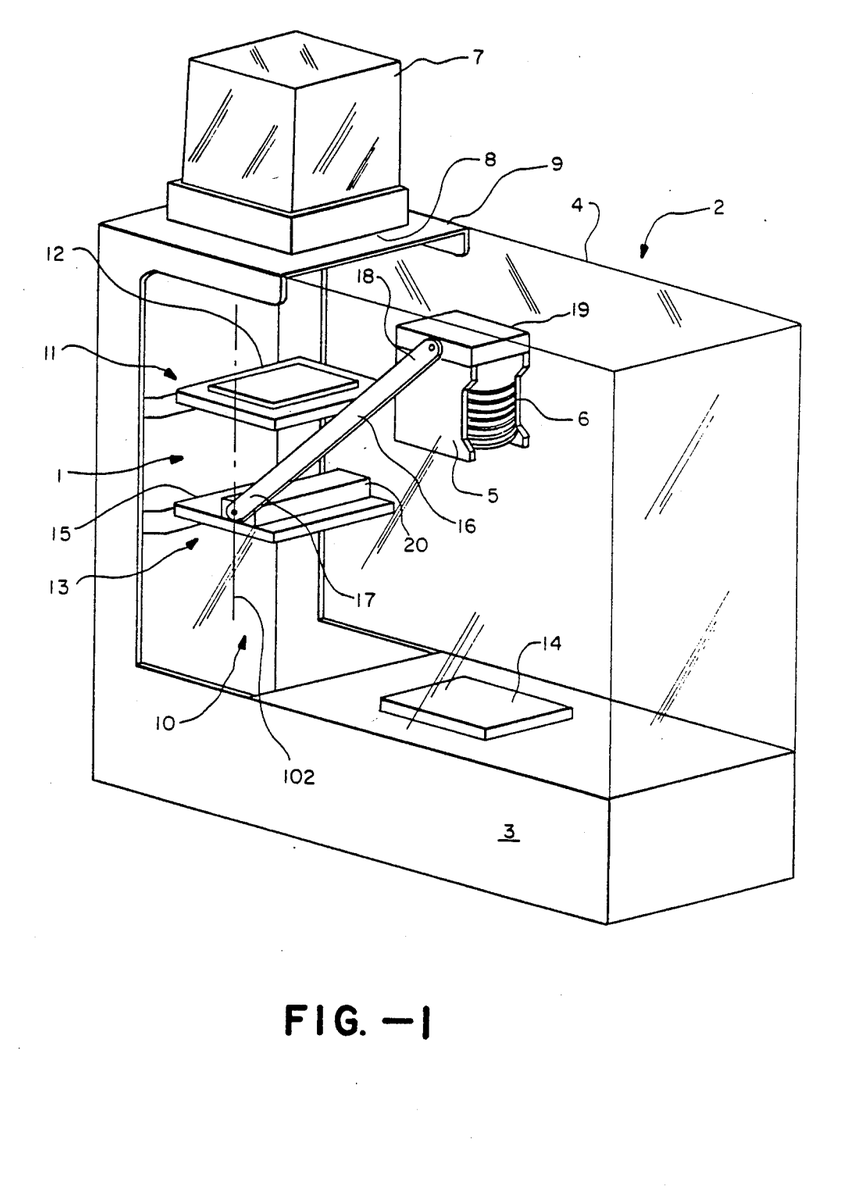
FIG. 1 is a perspective view of the manipulator according to the present invention with a simplified depiction of a processing station.

FIG. 1 shows a perspective view of the manipulator 1 of the present invention mounted with a simplified depiction of a processing station 2 with which the manipulator 1 is used. The processing station 2 includes a body 3 in which a processing step is conducted. For instance, when the articles to be processed are semiconductor wafers, the processing station may operate to place a layer of photoresist on the surface of the wafer. Of course, many other processing steps may be accomplished.

The processing station 2 includes a canopy 4 which covers the open parts of the body 3 of the processing station 2. The canopy 4 prevents particulate contamination inside the processing station 2. Manipulator 1 operates to remove a cassette 5 holding articles 6 to be processed from a container 7 through a cassette port 8 and transport the cassette 5 into the processing station 2. The cassette port 8 in preferred embodiment is described in detail in the prior commonly assigned application entitled BOX DOOR ACTUATED RETAINER referred to above and incorporated by reference as if fully set forth herein.

The manipulator 1 comprises a port plate 9 supporting the cassette port 8, and a shaft 10 including a central axis 102 extending from the cassette port 8 into the processing station 2. Alternatively, the cassette port 8 may be incorporated into the canopy 4 of the processing station 2. Preferably, the shaft 10 and central axis 102 extends vertically down from the cassette port 8 so that gravity operates to lower the cassette 5 from the container 7 when the cassette port 8 is open.

Further, the manipulator 1 includes a first means 11 for supporting the cassette 5 and transporting the cassette 5 along the central axis of shaft 10 through the cassette port 8 to and from the processing station 2. The first means 11 includes a first platform 12 that is supported in the shaft 10. The cassette 5 is supportable on the first platform 12 so that when the cassette port 8 is opened, the cassette 5 rests on the first platform 12. An alignment pin (not shown) may be mounted on the first platform 12 to support the cassette 5 or other means for holding the cassette 5 on the platform 12 may be used. As described in more detail with reference to FIG. 2 through FIG. 6, the first means includes a means for controllably moving the first platform 12 with the cassette supportable thereon through the shaft 10 from adjacent the port 8 to and from any position along the central axis 102 of the shaft 10. Thus the first platform 12 is moveable up the shaft to mate with and seal the cassette port 8. When the cassette port 8 opens, the cassette 5 is supported on the first platform 12. The first platform 12 may then be lowered along the shaft 10 into the processing station 2 with the cassette 5 riding on it.

The manipulator further includes a second means 13 that is transportable through the shaft 10 for transporting the cassette 5 to and from at least one location 14 away from the shaft 10 inside the processing station 2 and for transporting the cassette 5 to and from the first means 11 when the first means 11 is away form the cassette port 8.

The second means 13 includes a second platform 15 supported in the shaft 10. Further, a mechanical arm 16 is pivotally mounted on the second platform 15. The mechanical arm 16 includes a first end 17 and a second end 18. First end 17 is mounted pivotally on the second platform 15 and operable to pivot about the first end 17 in a plane orthogonal to the shaft 10.

Mounted on the second end 18 of the mechanical arm 16 is an engaging means 19 for engaging the cassette 5 holding articles 6 to be processed. The engaging means 19 is preferably pivotally mounted on the second end 18 of the mechanical arm 16 and includes a means for maintaining the cassette 5 upright, such as a bearing allowing gravity to vertically align the cassette 5 while engaged on the engaging means 19.

The second means 13 further includes a means for controllably moving the second platform 15 through the shaft 10. Also included is a means 20 for controlling the position of the second end 18 of the mechanical arm 16, such as a stepper motor or belt driven gear box mounted on the second platform 15. The means 20 for controlling the position of the second end 18 of the mechanical arm 16 operates in conjunction with engaging means 19 so that the cassette 5 is supported for transporting along the plane orthogonal to the central axis 102 of shaft 10 to and from the at least location 14 within the processing station 2 and to and from the first means 11.

Figure 4:
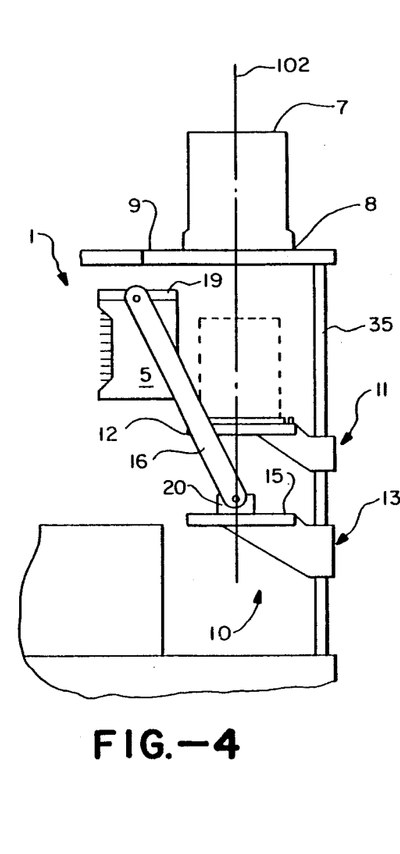
Figure 5:
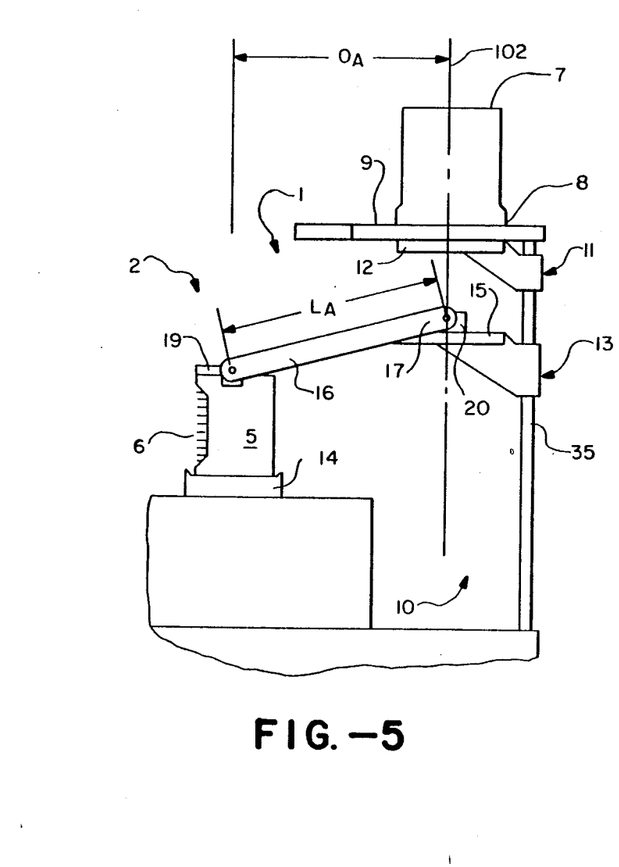
Figure 6:
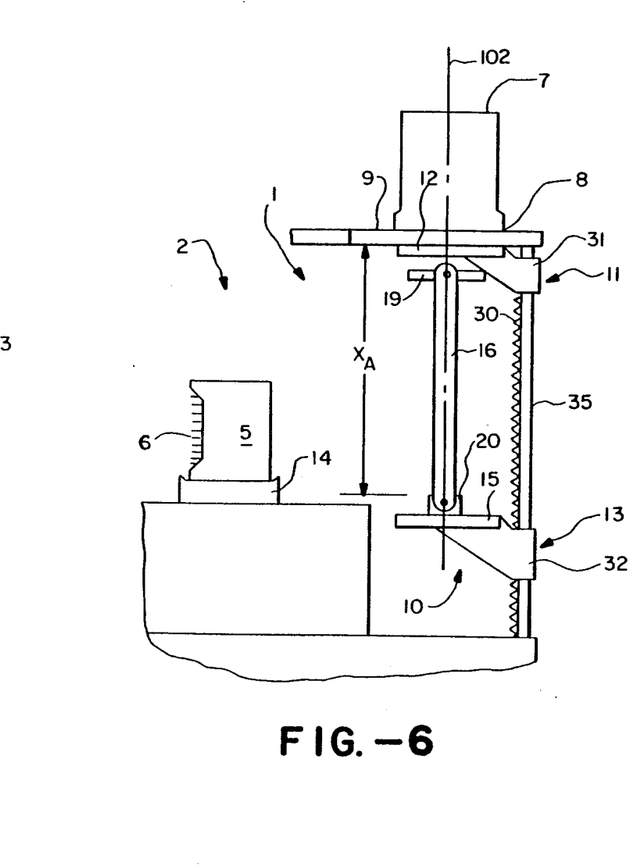

Further details of the preferred embodiment of the manipulator 1 according to the present invention is described with reference to FIG. 2 through FIG. 6, which show various positions of the manipulator 1 as it transports a cassette 5 from within the container 7 to a location 14 shown in FIG. 5 and 6. The parts of the manipulator 1 shown in FIG. 2 through 6 are labelled with reference numbers consistent with the view shown in FIG. 1 where appropriate.

Figure 2:
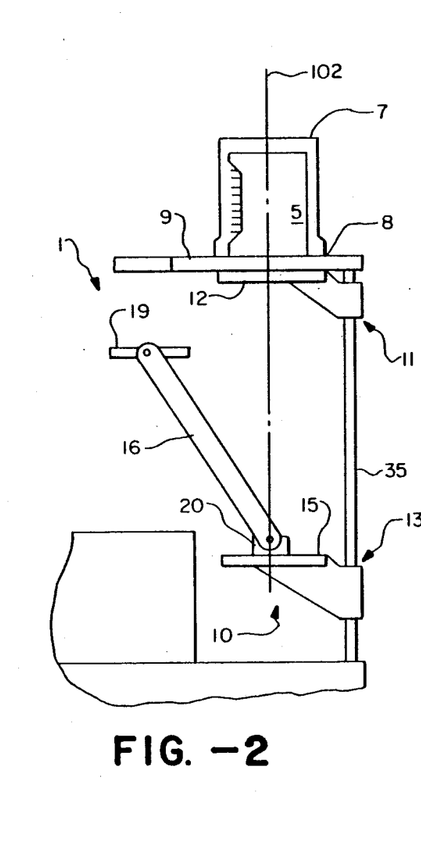
FIG. 2 through FIG. 6 are side view drawings of the manipulator according to the present invention used in description of the manipulation of a cassette holding articles to be processed from a SMIF container into the processing station.

FIG. 2 shows the manipulator 1 in a position for removing the cassette 5 from the container 7. The cassette 5 remains inside the container 7 on the processing station 2. The first platform 12 of the first means 11 is positioned adjacent the cassette port 8 on the port plate 9. The second means 13 is positioned low in the shaft 10 allowing a large range of freedom of movement in the shaft 10 by the first means 11.

Figure 3:
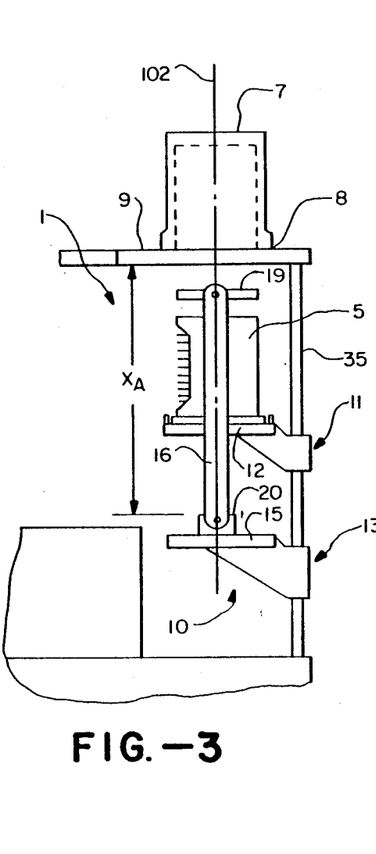

When the cassette port 8 releases the cassette 5, the first platform 12 is lowered into the shaft 10 as shown in FIG. 3. The second platform 15 of the second means 13 is raised slightly and the mechanical arm 16 is positioned using the stepper motor 20 so that the engaging means 19 is aligned over the cassette 5 while it is supported on the first platform 12.

The second means 13 is then lowered allowing the engaging means 19 to engage the cassette 5. Then it is raised as shown in FIG. 4 lifting the cassette 5 off of the first platform 12 while the mechanical arm 6 pivots and swings the cassette 5 along a plane orthogonal to the central axis 102 of shaft 10 out of the shaft 10. This allows the first means 11 to move along the shaft above the second means 13 so that the container 7 on the cassette port 8 may be closed by the first platform 12 of the first means 11.

As shown in FIG. 5, the first platform 12 is positioned adjacent the cassette port 8 sealing the container 7. The second platform 16 supporting the stepper motor 20 and the first end 17 of the mechanical arm is positioned along the shaft 10 as the mechanical arm 6 swings along the plane orthogonal to the shaft 10 to position the cassette at a location 14 inside the processing station 2. The position 14 is, at a maximum, offset from central axis 102 by a displacement, $O_A$, which is equal to the arm length, $L_A$.

As shown in FIG. 6, the second means 13 operates to lower the second platform 15 into the shaft 10 while the mechanical arm 16 is swung in alignment with the central axis 102 of shaft 10 below the first platform 12. In this manner, the mechanical arm 6 is positioned compactly in the shaft 10 with a clearance distance, $X_A$, which permits the coaxial loading and unloading of cassette 5 into and out from container 7 (see also FIG. 3). Cassette 5 moves and avoids interference with any manipulation that may occur in the processing station 2.

As can be seen, the manipulator 1 is operable to transport the cassette 5 to and from the first platform 12 of the first means 11 and while the cassette 5 is on the first platform 12, the manipulator 1 is operable to transport the cassette 5 to and from the container 7 mounted on a cassette port 8. These functions are accomplished in a minimum amount of space inside the processing station 2.

FIG. 6 schematically shows a particle shield 30 which is mounted along the shaft 10 isolating the mechanics in the means for transporting the first platform 12 and the second platform 15 along the shaft. The isolating shield 30 may be manufactured of an accordion-like folding plastic, such as mylar or other material, so that as the first means 11 and the second means 13 are transported along the shaft 10, the isolating shield 30 remains intact. Of course, other means for isolating the mechanics of the means for moving the first platform 12 and the second platform 15 may be utilized as suits the user.

The control signals operating the mechanical arm 16, the engaging means 19, the cassette port 8 and means for holding the cassette 5 on the first platform 12 are all transmitted through or along the support 31 in the first means 11 and the support 32 in the second means 13 to a control, such as a computer or other signal processing device (not shown).

Figure 7:
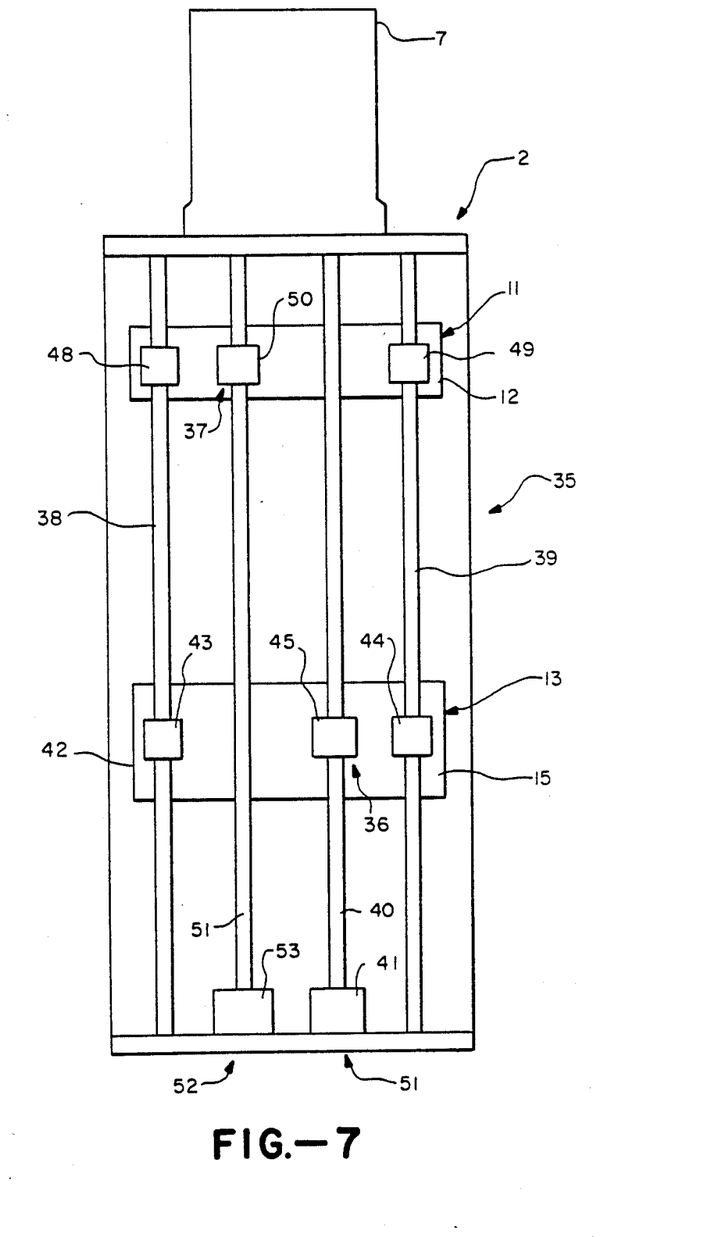
FIG. 7 is a backview of the manipulator according to the present invention showing a means for transporting the platforms along the shaft.

As can be seen in FIGS. 2 through 6, the first means 11 and the second means 13 are supported on a guide means 35 mounted in the shaft 10. FIG. 7 shows a back view of the guide means 35 on which the first means 11 and the second means 13 are mounted.

The guide means 35 includes a means 36 for controlling the position of the second platform 15 in the shaft 10 and a means 37 for controlling the position of the first platform 12 in the shaft 10. The means 36 comprises a worm gear apparatus 51 made up of a threaded bar 40 and a motor 41 for controllably rotating the threaded bar 40. Also, a means for supporting the second means 13, such as bearings 43, 44, on a first guide 38 and a second guide 39 are included. The second means 13 also includes a gear bearing 45 which mates with the threaded shaft 40 so that as the threaded shaft 40 is rotated by the motor 41, the position of the second means 13 in the shaft is controlled.

The means 37 for controlling the position of the first platform 12 in the shaft 10 is of a similar construction as the means 36. Thus, a bearing 48 and a bearing 49 are mounted with the first means 11 for supporting the first means 11 in alignment with the first guide 38 and the second guide 39, respectively. A gear bearing 50 is mounted on the first means 11 which mates with the threaded shaft 51 of the worm gear apparatus 52 which operates to control the moving of the first means 11 along the shaft 10. The threaded shaft 51 is rotated controllably by a motor 53 for controllably positioning the first means 11.

The bearings 48 and 49 for maintaining alignment of the first means 11 and the bearings 33 and 34 for maintaining alignment of the second means 13 must provide stable positioning of the first means 11 and the second means 13. Thus, the bearings may be altered to provide a three point support system (not shown) or the guides 38 and 39 and the bearings mating with the guides 38 and 39 should otherwise provide lateral support.

Figure 8:
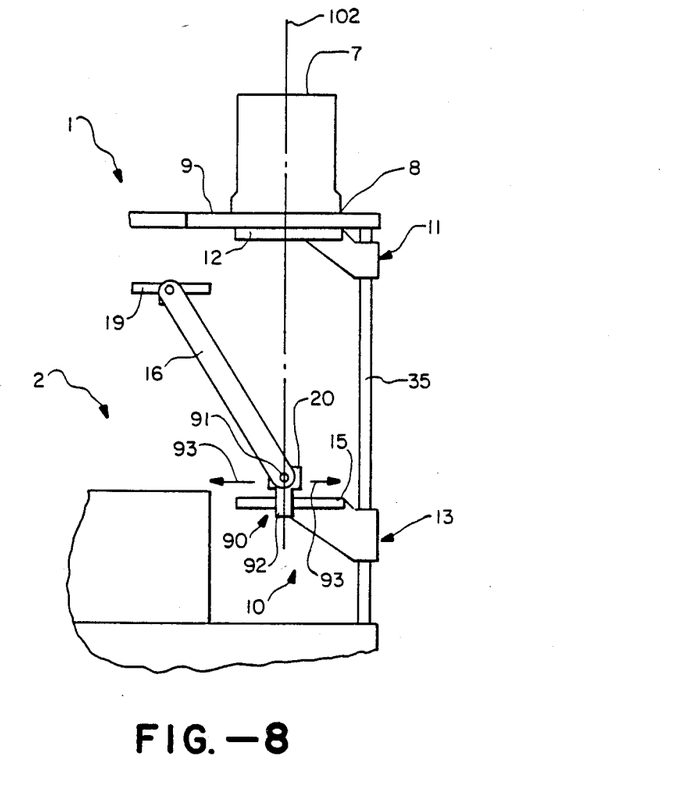
FIG. 8 is a side view drawing of one embodiment of the manipulator according to the present invention having a manipulator arm with a movable pivot point on a carriage on the second platform.

FIG. 8 shows the side view of the manipulator 1 according to an alternate embodiment of the present invention. In particular, the means 20 for controlling the position of the second end 18 of the manipulator arm 16 further includes a carriage and rail assembly 90 on the second platform 15. The pivot point 91 on the first end of the manipulator arm 16 is mounted on the stepper motor or gear box as described above. The stepper motor or gear box is in turn mounted on a carriage 92 on the second platform 15. The second platform 15 includes a rail 93 which guides the carriage 92 along an axis defining a direction 93 orthogonal to the shaft 10. The carriage and rail assembly 90 provides means for positioning the pivoting point 91 of the manipulator arm 16 to provide further flexibility in positioning a cassette mounted on the engaging means 19 within the processing station 2. The carriage position is controlled by a motor or belt driven apparatus such as are well known in the art (not shown).

In summary, disclosed is a manipulator for removing a cassette holding articles, such as semiconductor wafers, to be processed from a container into a processing station in a standard mechanical interface (SMIF) system. The container is supported on a cassette port on the manipulator of the processing station. A first platform is transportable along a shaft below the nassette port and is operable to mate with the cassette port and receive the cassette from the container. The first platform is transported down the shaft, thereby removing the cassette from the container. A second platform mounted in the shaft includes a manipulator arm which swings to engage the cassette on the first platform and support the cassette off of the first platform. The manipulator arm then pivots to transport the cassette to a location in the processing station away from the shaft. The first platform is then transported back up the shaft to the cassette port to seal the container to prevent particulate contamination. The manipulator arm and the second platform after placing the cassette at a location in the processing station away from the shaft, are then positionable completely inside the shaft to minimize the space taken up in the processing station by the manipulator.

The foregoing description of a preferred embodiment of the invention has been presented for the purposes of illustration and description. It is not intended to be exhaustive or to limit the invention to the precise form disclosed, and obviously many modifications and variations are possible in light of the above teachings. Thus, further aspects of the invention can be determined by a study of the specification, the drawings and the claims. It is intended that the scope of the invention be defined by the claims appended hereto.

While the invention has been particularly shown and described with reference to preferred embodiments thereof, it will be understood by those skilled in the art that the foregoing and other changes in form and detail may be made therein without departing from the spirit and scope of the invention.

We claim:

1. An apparatus for transferring a cassette holding articles to be processed to and from a container supported at a processing station where the processing station has a cassette port for receiving the cassette when the cassette moves along a central axis extending from outside the processing station through the cassette port, and into the processing station, said apparatus comprising:

cassette platform means including a cassette platform transportable along said axis for transferring the cassette to and from the container along said axis;
   manipulator means including an arm platform transportable along said axis and including an arm pivotably attached to said platform for engaging said cassette for transferring the cassette to and from said axis to a location offset from said axis whereby said cassette platform can travel along said axis bypassing said cassette.

2. The apparatus of claim 1 wherein said cassette platform means further includes host elevator means attached to said cassette platform for positioning the cassette platform and the cassette along said axis.

3. The apparatus of claim 1 wherein:
   said cassette platform means includes means for controlling the position of said cassette platform with the cassette supportable thereon along said axis,
   said manipulator means includes means for controlling the position of said arm platform along said axis, and wherein said arm has a first end and a second end, said arm pivotally attached to said first end on said cassette platform and operable to pivot about said first end in a plane parallel to said axis,
   engaging means mounted to said second end of said arm for engaging the cassette,
   means for controlling the position of said second end so that said engaging means supports the cassette during transporting along said plane.

4. The apparatus of claim 3, wherein the cassette is supported on said cassette platform and said engaging further includes means for maintaining the cassette upright while engaged by said engaging means.

5. The apparatus of claim 3, wherein said cassette platform travels a first length along said axis and said arm has a second length shorter than said first length so that said arm may be positioned parallel to said axis.

6. The apparatus of claim 3, further including:
   means for preventing particulate contamination from travelling into the processing station from said means for controlling the position of said cassette platform and said means for controlling the position of said arm platform.

7. The apparatus of claim 3, wherein:
   said cassette platform includes means for sealing the cassette port when the cassette platform is positioned adjacent the cassette port.

8. The apparatus of claim 3, wherein:
   said means for controlling the position of said cassette platform includes a first worm gear apparatus; and
   said means for controlling the position of said arm platform includes a second worm gear apparatus.

9. The apparatus of claim 3, wherein;
   said means for controlling the position of said second end further includes means for controlling the position of said first end on said arm platform along an axis orthogonal to said central axis.

10. In a standard mechanical interface system, an apparatus for transferring a cassette holding articles to be processed to and from a container supported on a cassette port for receiving the cassette when the cassette moves along a central axis from outside the processing station through the cassette port, and into the processing station, said apparatus comprising:
    a cassette platform for supporting the cassette, transportable along said axis and adapted to seal the cassette port when positioned adjacent the cassette port;

cassette transport means for controlling the position of said cassette platform along said axis;
an arm platform transportable along said axis;
a mechanical arm, extending an arm length between a first end and a second end, said first end mounted pivotally on said arm platform and operable to pivot in a plane orthogonal to said axis whereby said arm is pivotal between said central axis and said arm length from said central axis;
engaging means mounted to said second end of said mechanical arm for engaging the cassette;
arm transport means for controlling the position of said arm platform along said shaft; and
means for controlling the position of said second end so that said engaging means supports the cassette for transporting along said plane orthogonal to said shaft to and from said at least one location within the processing station and to and from said cassette platform.

11. The apparatus of claim 10, wherein the cassette is supported on said cassette platform and said engaging means further includes means for maintaining the cassette upright while engaged on said engaging means.

12. The apparatus of claim 10, wherein said cassette platform travels a first length along said axis and said mechanical arm has a second length shorter than said first length so that said mechanical arm may be positioned with said second end along said axis.

13. The apparatus of claim 10, further including:
means for preventing particulate contamination from traveling into the processing station from said means for controlling the position of said cassette platform and said means for controlling the position of said arm platform.

14. The apparatus of claim 10, wherein:
said articles to be processed include semiconductor material.

15. The apparatus of claim 10, wherein:
said means for controlling the position of said cassette platform includes a first worm gear apparatus; and
said means for controlling the position of said arm platform includes a second worm gear apparatus.

16. The apparatus of claim 10, wherein;
said means for controlling the position of said second end further includes means for controlling the position of said first end on said arm platform along an axis orthogonal to said central axis.

* * * * *